US012795945B2

(12) United States Patent
Kim et al.

(10) Patent No.: US 12,795,945 B2
(45) Date of Patent: Nov. 10, 2026

(54) SEMICONDUCTOR DEVICES

(71) Applicant: Samsung Electronics Co., Ltd., Suwon-si (KR)

(72) Inventors: Junhoe Kim, Suwon-si (KR); Hyunchul Shin, Suwon-si (KR); Jayeong Hyeon, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 577 days.

(21) Appl. No.: 18/302,832

(22) Filed: Apr. 19, 2023

(65) Prior Publication Data

US 2024/0081083 A1 Mar. 7, 2024

(30) Foreign Application Priority Data

Sep. 7, 2022 (KR) ........................ 10-2022-0113291

(51) Int. Cl.
*H10N 50/10* (2023.01)
*H10B 61/00* (2023.01)
*H10N 50/80* (2023.01)

(52) U.S. Cl.
CPC .................................... *H10B 61/00* (2023.02)

(58) Field of Classification Search
CPC ........ H10B 61/20; H10B 61/22; H10B 61/00; H10N 50/80; H10N 50/10; H10N 50/01
See application file for complete search history.

(56) References Cited

U.S. PATENT DOCUMENTS 9,595,662 B2 3/2017 Li et al.
10,483,461 B2 11/2019 Yi et al.
10,510,587 B2 12/2019 Huang et al.
10,833,257 B1 11/2020 Dutta et al.
10,910,260 B2 2/2021 Huang et al.
11,217,627 B2 1/2022 Chuang et al.
11,271,150 B2 3/2022 Peng et al.
2018/0308899 A1* 10/2018 Chuang .................. H10N 50/01
2020/0106007 A1* 4/2020 Peng ...................... H10B 61/10
2021/0305494 A1* 9/2021 Dutta ..................... H10N 50/10
2022/0310902 A1* 9/2022 Wang ..................... H10B 61/00
2022/0376167 A1* 11/2022 Kuo ....................... H10B 61/00
2023/0061143 A1* 3/2023 Chen ...................... H10B 61/00

FOREIGN PATENT DOCUMENTS

KR 10-2022-0112376 A 8/2022

* cited by examiner

*Primary Examiner* — Ismail A Muse
(74) *Attorney, Agent, or Firm* — Wolf, Greenfield & Sacks, P.C.

(57) ABSTRACT

A semiconductor device includes a substrate including cell and peripheral regions, and a boundary region therebetween, a lower insulating layer on the cell region and extending onto the boundary and peripheral regions, data storage patterns on the lower insulating layer on the cell region, a cell insulating layer on the lower insulating layer on the cell region and on the data storage patterns, a first upper insulating layer on the cell insulating layer, peripheral conductive lines on the lower insulating layer on the peripheral region, and a peripheral insulating layer on the lower insulating layer on the peripheral region and on the peripheral conductive lines. The peripheral insulating layer extends onto the lower insulating layer on the boundary region to be in contact with side surfaces of the cell insulating layer and the first upper insulating layer. The peripheral insulating layer includes a material different from the cell insulating layer.

16 Claims, 10 Drawing Sheets

SEMICONDUCTOR DEVICES

CROSS-REFERENCE TO RELATED APPLICATION

This U.S. non-provisional patent application claims priority under 35 U.S.C. § 119 to Korean Patent Application No. 10-2022-0113291, filed on Sep. 7, 2022, in the Korean Intellectual Property Office, the entire contents of which are hereby incorporated by reference.

BACKGROUND OF THE INVENTION

The inventive concept relates to a semiconductor device and a method of manufacturing the same, and more particularly, relates to a semiconductor device including a magnetic tunnel junction and a method of manufacturing the same.

With high-speed and/or low-power consumption of electronic devices, demands for high-speed and/or low operating voltages of semiconductor memory elements included in the electrical devices have increased. In order to satisfy these demands, a magnetic memory element has been proposed as a semiconductor memory element. The magnetic memory element may have characteristics such as high-speed operation and/or non-volatility, and thus the magnetic memory element has attracted attention as a next-generation semiconductor memory element.

In general, the magnetic memory element may include a magnetic tunnel junction pattern (MTJ). The magnetic tunnel junction pattern may include two magnetic substances and an insulating layer interposed therebetween. A resistance value of the magnetic tunnel junction pattern may vary depending on magnetization directions of the two magnetic substances. For example, when the magnetization directions of the two magnetic substances are antiparallel, the magnetic tunnel junction pattern may have a high resistance value, and when the magnetization directions of the two magnetic substances are parallel, the magnetic tunnel junction pattern may have a small resistance value. Data may be written/read using a difference of resistance values.

According to various demands of the electronic industry, various studies on semiconductor devices having an embedded structure in which a magnetic tunnel junction pattern is disposed between metal wirings are being conducted.

SUMMARY

An object of the inventive concept is to provide a semiconductor device with a simplified manufacturing process and a method of manufacturing the same.

An object of the inventive concept is to provide a semiconductor device that is easily manufactured and is capable of reducing/minimizing defects during a manufacturing process, and a method of manufacturing the same.

A semiconductor device according to some embodiments of the inventive concept may include a substrate including a cell region, a peripheral region, and a boundary region therebetween, a lower insulating layer on the cell region and extending onto the boundary region and the peripheral region, data storage patterns on the lower insulating layer on the cell region, a cell insulating layer on the lower insulating layer on the cell region and on (e.g., covering) the data storage patterns, a first upper insulating layer on the cell insulating layer, peripheral conductive lines on the lower insulating layer on the peripheral region, and a peripheral insulating layer on the lower insulating layer on the peripheral region and on (e.g., covering) the peripheral conductive lines. The peripheral insulating layer may extend onto the lower insulating layer on the boundary region to be in contact with a side surface of the cell insulating layer and a side surface of the first upper insulating layer. The peripheral insulating layer may include a material different from a material of the cell insulating layer.

A semiconductor device according to some embodiments of the inventive concept may include a substrate including a cell region, a peripheral region, and a boundary region therebetween, a lower insulating layer on the cell region and extending onto the boundary region and the peripheral region, data storage patterns on the lower insulating layer on the cell region, a cell insulating layer on the lower insulating layer on the cell region and on (e.g., covering) the data storage patterns, peripheral conductive lines on the lower insulating layer on the peripheral region, and a peripheral insulating layer on the lower insulating layer on the peripheral region and on (e.g., covering) the peripheral conductive lines. The peripheral insulating layer may include a material different from a material of the cell insulating layer. The peripheral insulating layer may extend onto the lower insulating layer on the boundary region and has a stepped structure on the boundary region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Hereinafter, the inventive concept will be described in detail by describing example embodiments of the inventive concept with reference to the accompanying drawings.

Figure 1:
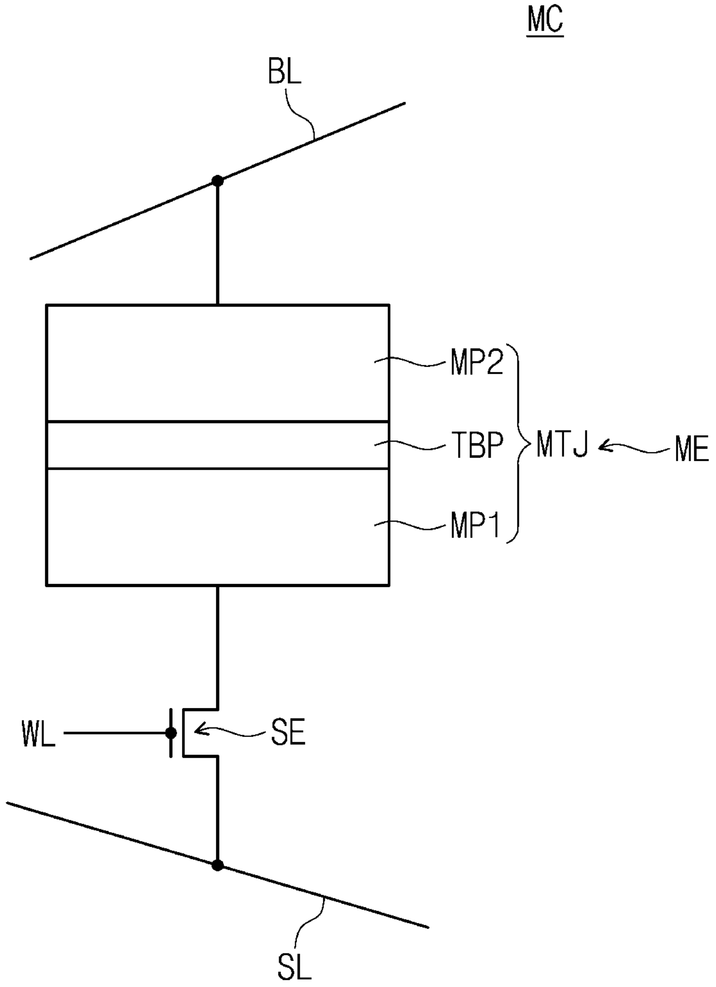
FIG. 1 is a circuit diagram illustrating a unit memory cell of a semiconductor device according to some embodiments.

FIG. 1 is a circuit diagram illustrating a unit memory cell of a semiconductor device according to some embodiments.

Referring to FIG. 1, a unit memory cell MC may include a memory element ME and a selection element SE. The memory element ME and the selection element SE may be electrically connected to each other in series. The memory element ME may be connected between a bit line BL and the selection element SE. The selection element SE may be connected between the memory element ME and a source line SL and may be controlled by a word line WL. The selection element SE may include, for example, a bipolar transistor or a MOS field effect transistor.

The memory element ME may include a magnetic tunnel junction pattern MTJ including magnetic patterns MP1 and MP2 spaced apart from each other and a tunnel barrier pattern TBP between the magnetic patterns MP1 and MP2.

One of the magnetic patterns MP1 and MP2 may be a reference magnetic pattern having a magnetization direction fixed in one direction regardless of an external magnetic field under a normal use environment. Another one of the magnetic patterns MP1 and MP2 may be a free magnetic pattern in which a magnetization direction is changed between two stable magnetization directions by an external magnetic field. An electrical resistance of the magnetic tunnel junction pattern MTJ may be much greater when the magnetization directions of the reference magnetic pattern and the free magnetic pattern are antiparallel to each other than when magnetization directions thereof are parallel to each other. That is, the electrical resistance of the magnetic tunnel junction pattern MTJ may be adjusted by changing the magnetization direction of the free magnetic pattern. Accordingly, the memory element ME may store data in the unit memory cell MC using a difference in electrical resistance depending on the magnetization directions of the reference magnetic pattern and the free magnetic pattern.

Figure 2:
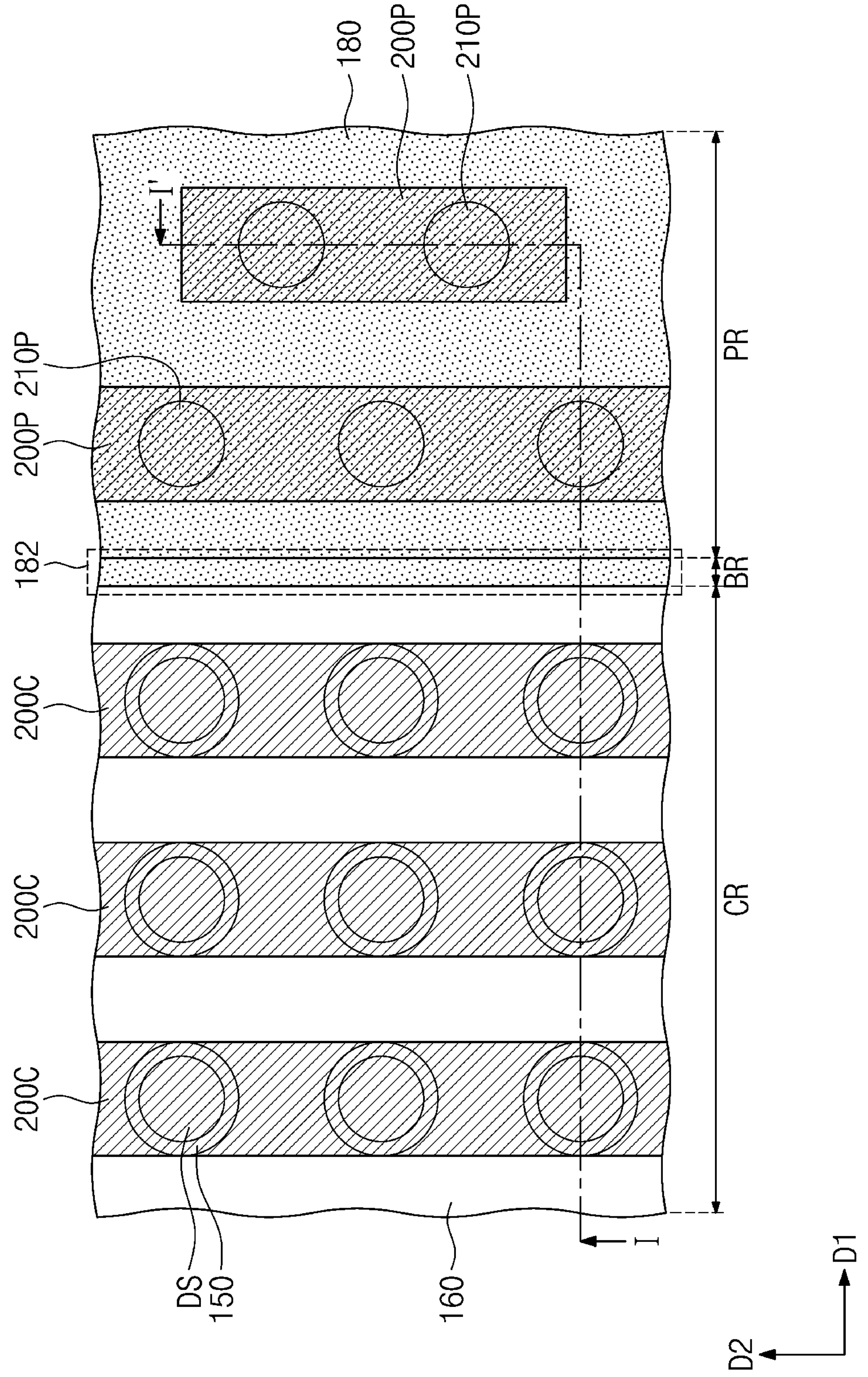
FIG. 2 is a plan view of a semiconductor device according to some embodiments.
Figure 3:
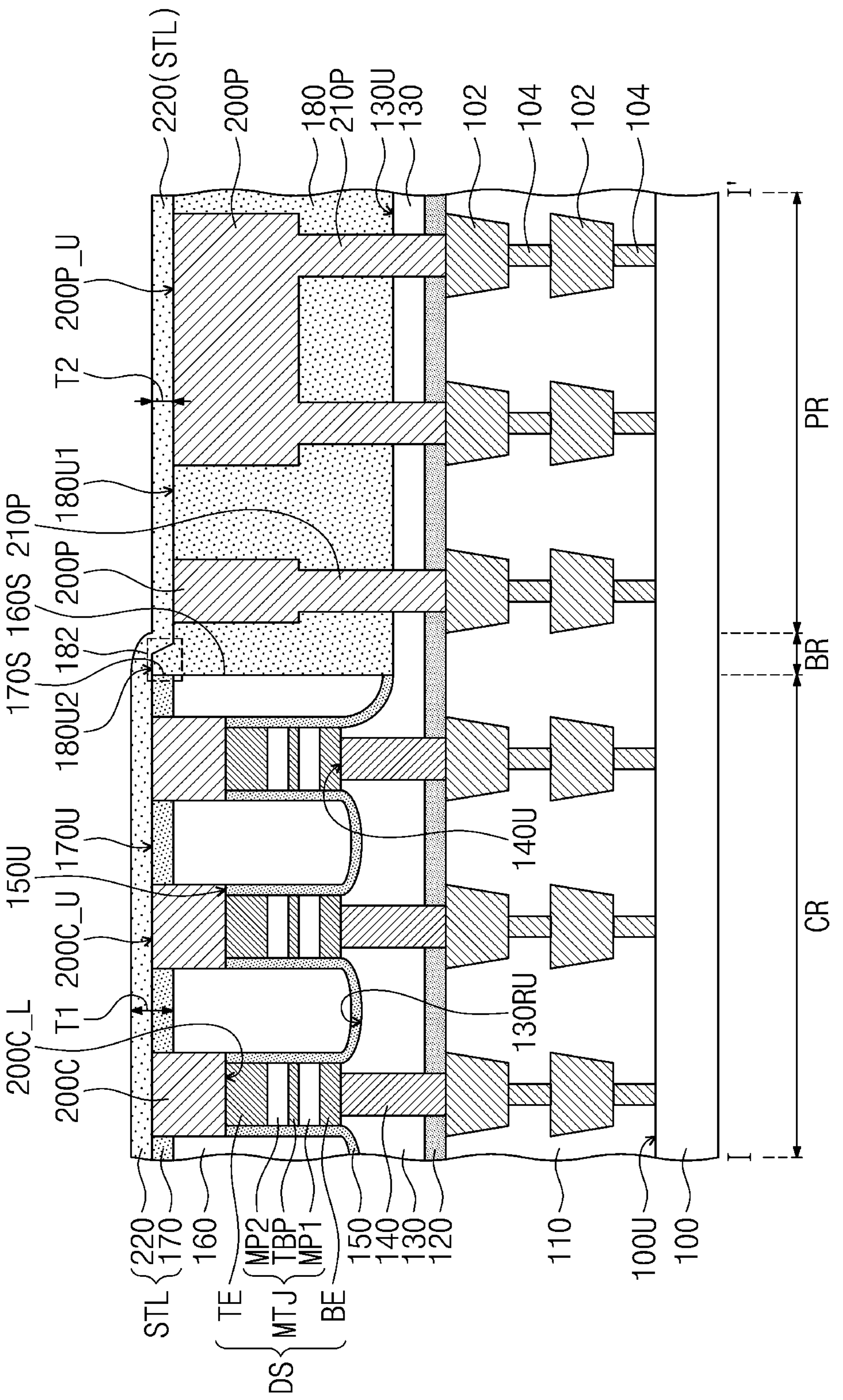
FIG. 3 is a cross-sectional view taken along line I-I' in FIG. 2.
Figure 4A:
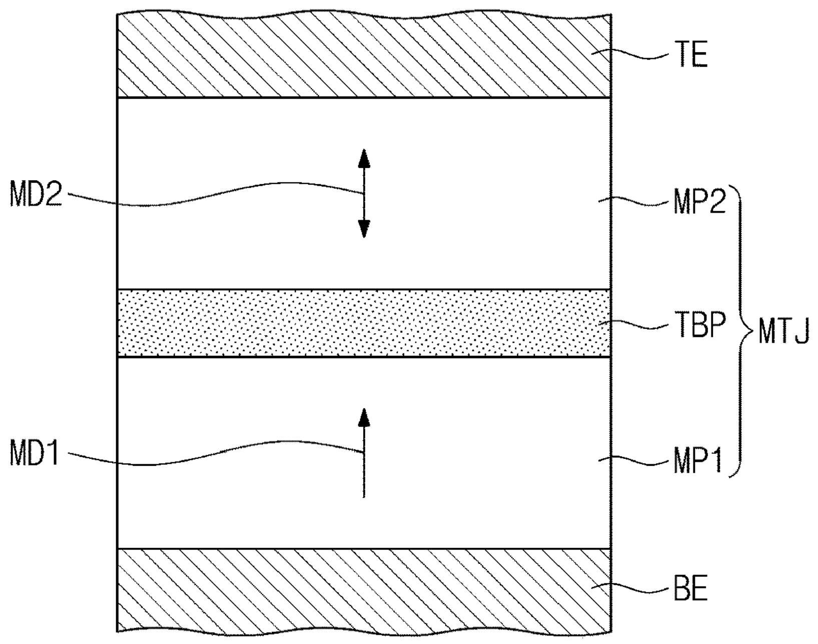
FIGS. 4A and 4B are cross-sectional views illustrating examples of magnetic tunnel junction patterns of a semiconductor device according to some embodiments, respectively.
Figure 4B:
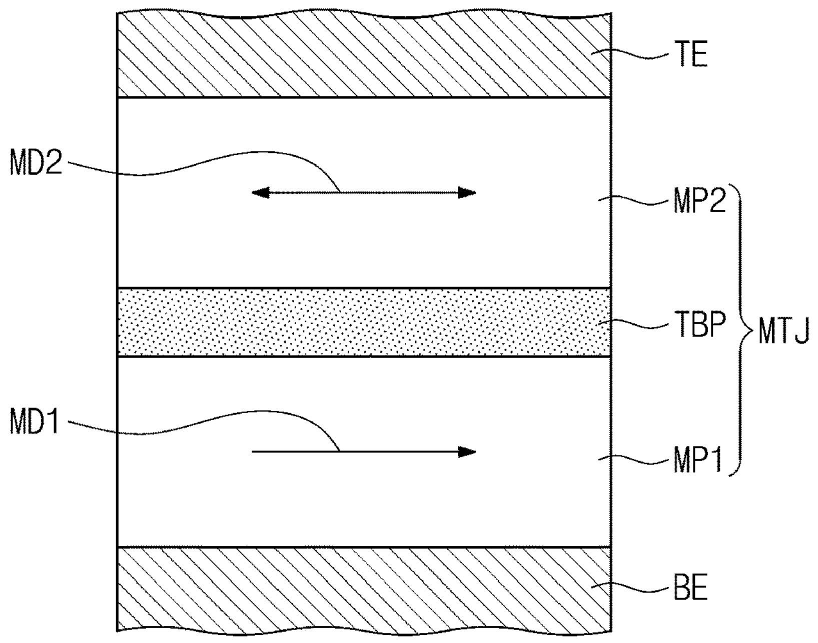

FIG. 2 is a plan view of a semiconductor device according to some embodiments. FIG. 3 is a cross-sectional view taken along line I-I' in FIG. 2. FIGS. 4A and 4B are cross-sectional views illustrating examples of magnetic tunnel junction patterns of a semiconductor device according to some embodiments, respectively.

Referring to FIGS. 2 and 3, a substrate 100 including a cell region CR, a peripheral region PR, and a boundary region BR therebetween may be provided. The substrate 100 may be a semiconductor substrate including silicon (Si), silicon on insulator (SOI), silicon germanium (SiGe), germanium (Ge), gallium arsenide (GaAs), or the like. The cell region CR may be a region of the substrate 100 on which the memory cells MC of FIG. 1 are provided, and the peripheral region PR may include another region of the substrate 100 on which peripheral circuits for driving the memory cells MC are provided. The boundary region BR may be still another region of the substrate 100 provided between the cell region CR and the peripheral region PR.

Wiring structures 102 and 104 may be disposed on the substrate 100. The wiring structures 102 and 104 may be disposed on the cell region CR and the peripheral region PR of the substrate 100. The wiring structures 102 and 104 may include wiring lines 102 vertically spaced apart from the substrate 100 and wiring contacts 104 connected to the wiring lines 102. The wiring lines 102 may be spaced apart from an upper surface 100U of the substrate 100 in a direction perpendicular to the upper surface 100U of the substrate 100. The wiring contacts 104 may be disposed between the substrate 100 and the wiring lines 102, and each of the wiring lines 102 may be electrically connected to the substrate 100 through a corresponding one of the wiring contacts 104. The wiring lines 102 and the wiring contacts 104 may include metal (e.g., copper).

Selection elements (SE in FIG. 1) may be disposed on the substrate 100. The selection elements may be, for example, field effect transistors. Each of the wiring lines 102 may be electrically connected to a terminal (e.g., a drain terminal) of a corresponding one of the selection elements through a corresponding one of the wiring contacts 104.

A wiring insulating layer 110 may be disposed on the substrate 100 to cover the wiring structures 102 and 104. The wiring insulating layer 110 may be disposed on the cell region CR and the peripheral region PR of the substrate 100, and may extend onto the boundary region BR of the substrate 100. The wiring insulating layer 110 may expose upper surfaces of uppermost wiring lines 102 of the wiring lines 102. The wiring insulating layer 110 may not extend on (e.g., may not cover) the upper surfaces of the uppermost wiring lines 102 of the wiring lines 102. Accordingly, the upper surfaces of the uppermost wiring lines 102 of the wiring lines 102 may be free of the wiring insulating layer 110. For example, an upper surface of the wiring insulating layer 110 may be substantially coplanar with the upper surfaces of the uppermost wiring lines 102. The wiring insulating layer 110 may include, for example, silicon oxide, silicon nitride, and/or silicon oxynitride.

A protective insulating layer 120 may be disposed on the wiring insulating layer 110 and may cover the upper surfaces of the uppermost wiring lines 102, which are free of the wiring insulating layer 110. The protective insulating layer 120 may be disposed on the wiring insulating layer 110 on the cell region CR and may extends onto the wiring insulating layer 110 which is on the boundary region BR and the peripheral region PR. The protective insulating layer 120 may include, for example, silicon oxide, silicon nitride, and/or silicon oxynitride.

A lower insulating layer 130 may be disposed on the protective insulating layer 120. The lower insulating layer 130 may be disposed on the protective insulating layer 120 on the cell region CR and may extend onto the protective insulating layer 120 which is on the boundary region BR and the peripheral region PR. The protective insulating layer 120 may be interposed between the wiring insulating layer 110 and the lower insulating layer 130 on the cell region CR, the boundary region BR, and the peripheral region PR. The lower insulating layer 130 may include, for example, silicon oxide, silicon nitride, and/or silicon oxynitride.

Data storage patterns DS may be disposed on the lower insulating layer 130 on the cell region CR. The data storage patterns DS may be spaced apart from each other in a first direction D1 and a second direction D2 that are parallel to the upper surface 100U of the substrate 100 and cross each other. The lower insulating layer 130 on the cell region CR may have an upper surface 130RU recessed toward the substrate 100 between the data storage patterns DS. An upper surface 130U of the lower insulating layer 130 on the peripheral region PR may be positioned at a height lower than the recessed upper surface 130RU (e.g., a lowermost end of the recessed upper surface 130RU) of the lower insulating layer 130 on the cell region PR. In this specification, the height is a distance measured from the upper surface 100U of the substrate 100 in a direction perpendicular to the upper surface 100U of the substrate 100.

Lower electrode contacts 140 may be disposed in the lower insulating layer 130 on the cell region CR, and may be spaced apart from each other in the first direction D1 and the second direction D2. The lower electrode contacts 140 may be respectively disposed below the data storage patterns DS and may be electrically connected to the data storage patterns DS, respectively. Each of the lower electrode contacts 140 may pass through the lower insulating layer 130 and the protective insulating layer 120 on the cell region CR, and may be electrically connected the corresponding one of the uppermost wiring lines 102. Upper surfaces 140U of the lower electrode contacts 140 may be positioned at a height higher than the recessed upper surface 130RU (e.g., a lowermost end of the recessed upper surface 130RU) of the lower insulating layer 130 on the cell region PR. The lower electrode contacts 140 may include a doped semiconductor material (e.g., doped silicon), a metal (e.g., tungsten, titanium, and/or tantalum), a metal-semiconductor compound (e.g., metal silicide), and a conductive metal nitride. (ex, titanium nitride, tantalum nitride, and/or tungsten nitride).

The data storage patterns DS may be respectively disposed on the lower electrode contacts 140 and electrically connected to the lower electrode contacts 140, respectively. Each of the data storage patterns DS may include a lower electrode BE, a magnetic tunnel junction pattern MTJ, and an upper electrode TE sequentially stacked on each of the lower electrode contacts 140. The lower electrode BE may be disposed between each of the lower electrode contacts 140 and the magnetic tunnel junction pattern MTJ, and the magnetic tunnel junction pattern MTJ may be disposed between the lower electrode BE and the upper electrodes TE. The magnetic tunnel junction pattern MTJ may include a first magnetic pattern MP1, a second magnetic pattern MP2, and a tunnel barrier pattern TBP therebetween. The first magnetic pattern MP1 may be disposed between the lower electrode BE and the tunnel barrier pattern TBP, and the second magnetic pattern MP2 may be disposed between the upper electrode TE and the tunnel barrier pattern TBP. The lower electrode BE may include, for example, a conductive metal nitride (e.g., titanium nitride or tantalum nitride). The upper electrode TE may include at least one of a metal (e.g., Ta, W, Ru, Ir, etc.) and a conductive metal nitride (e.g., TiN).

Referring to FIGS. 4A and 4B, the first magnetic pattern MP1 may be a reference layer having a magnetization direction MD1 fixed in one direction, and the second magnetic pattern MP2 may be a free layer having a magnetization direction MD2 changeable to be parallel or antiparallel to the magnetization direction MD1 of the first magnetic pattern MP1. FIGS. 4A and 4B respectively disclose a case in which the second magnetic pattern MP2 is a free layer as an example, but the inventive concept is not limited thereto. Unlike FIGS. 4A and 4B, the first magnetic pattern MP1 may be a free layer and the second magnetic pattern MP2 may be a reference layer.

Referring to FIG. 4A, for example, the magnetization directions MD1 and MD2 of the first magnetic pattern MP1 and the second magnetic pattern MP2 may be perpendicular to an interface the tunnel barrier pattern TBP and the second magnetic pattern MP2. In this case, each of the first magnetic pattern MP1 and the second magnetic pattern MP2 may include at least one of an intrinsic perpendicular magnetic substance and an extrinsic perpendicular magnetic substance. The intrinsic perpendicular magnetic substance may include a material having perpendicular magnetization characteristics even when there is no external factor. The intrinsic perpendicular magnetic substance may include at least one of i) perpendicular magnetic substance (e.g., CoFeTb, CoFeGd, CoFeDy), ii) perpendicular magnetic substance having an L10 structure, iii) CoPt having a hexagonal close packed lattice structure, and iv) vertical magnetic structures. The perpendicular magnetic substance having the L10 structure may include at least one of FePt of L10 structure, FePd of L10 structure, CoPd of L10 structure, or CoPt of L10 structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n ("n" is the number of stacking). The extrinsic perpendicular magnetic substance may include a material having intrinsic horizontal magnetization characteristics and perpendicular magnetization characteristics due to an external factor. For example, the extrinsic perpendicular magnetic substance may have the perpendicular magnetization characteristics due to magnetic anisotropy induced by making a junction of the first magnetic pattern MP1 (or the second magnetic pattern MP2) and the tunnel barrier pattern TBP. The extrinsic perpendicular magnetic substance may include, for example, CoFeB.

Referring to FIG. 4B, as another example, the magnetization directions MD1 and MD2 of the first magnetic pattern MP1 and the second magnetic pattern MP2 may be parallel to the interface the tunnel barrier pattern TBP and the second magnetic pattern MP2. In this case, each of the first magnetic pattern MP1 and the second magnetic pattern MP2 may include a ferromagnetic substance. The first magnetic pattern MP1 may further include an antiferromagnetic substance for fixing a magnetization direction of the ferromagnetic substance in the first magnetic pattern MP1.

Each of the first magnetic pattern MP1 and the second magnetic pattern MP2 may include a Co-based Heusler alloy (e.g., a Heusler alloy including Co). The tunnel barrier pattern TBP may include at least one of a magnesium (Mg) oxide layer, a titanium (Ti) oxide layer, an aluminum (Al) oxide layer, a magnesium-zinc (Mg—Zn) oxide layer, or a magnesium-boron (Mg—B) oxide layer.

Referring back to FIGS. 2 and 3, a capping insulating layer 150 may be disposed on the lower insulating layer 130 on the cell region CR, and may cover the recessed upper surface 130RU of the lower insulating layer 130 on the cell region CR. The capping insulating layer 150 may extend on a side surface of each of the data storage patterns DS, and may surround each of the side surfaces of the data storage patterns DS when viewed from a plan view. The capping insulating layer 150 may cover side surfaces of the lower electrode BE, the magnetic tunnel junction pattern MTJ, and the upper electrode TE, may surround the side surfaces of the lower electrode BE, the magnetic tunnel junction pattern MTJ, and the upper electrode TE when viewed from a plan view. The capping insulating layer 150 may include nitride (e.g., silicon nitride).

A cell insulating layer 160 may be disposed on the lower insulating layer 130 on the cell region CR and may cover the data storage patterns DS. In some embodiments, the data storage patterns DS (e.g., at least portions of the data storage patterns DS) may be in the cell insulating layer 160. The cell insulating layer 160 may fill a space between the data storage patterns DS. The capping insulating layer 150 may be interposed between the side surface of each of the data storage patterns DS and the cell insulating layer 160, and may extend between the recessed upper surface 130RU of the lower insulating layer 130 on the cell region CR and the cell insulating layer 160. The cell insulating layer 160 may include, for example, silicon oxide, silicon nitride, and/or silicon oxynitride. For example, the cell insulating layer 160 may include tetra-ethyl ortho-silicate (TEOS) oxide.

A first upper insulating layer 170 may be disposed on the cell region CR and the cell insulating layer 160. The first upper insulating layer 170 may include a material different from a material of the cell insulating layer 160. The first upper insulating layer 170 may include, for example, silicon nitride (e.g., SiCN).

Cell conductive lines 200C may be disposed on the cell region CR. The cell conductive lines 200C may be spaced apart from each other in the first direction D1 and may extend in (e.g., extend longitudinally in) the second direction D2. Each of the cell conductive lines 200C may have a line shape extending in the second direction D2. The data storage patterns DS spaced apart from each other in the first direction D1 may be electrically connected to the cell conductive lines 200C, respectively. The data storage patterns DS spaced apart from each other in the second direction D2 may be electrically connected to a corresponding one of the cell conductive lines 200C. Each of the cell conductive lines 200C may pass through the first upper insulating layer 170 and may pass through an upper portion of the cell insulating layer 160 to be connected to the data storage patterns DS. The data storage patterns DS may be connected to bottom surfaces 200C_L of the cell conductive lines 200C, and the uppermost surface 150U of the capping insulating layer 150 may be in contact with the bottom surfaces 200C_L of the cell conductive lines 200C. Upper surfaces 200C_U of the cell conductive lines 200C may be not covered by the first upper insulating layer 170 and may be exposed. The first upper insulating layer 170 may not extend on (e.g., may not cover) the upper surfaces 200C_U of the cell conductive lines 200C. Accordingly, the upper surfaces 200C_U of the cell conductive lines 200C may be free of the first upper insulating layer 170. The upper surfaces 200C_U of the cell conductive lines 200C may be substantially coplanar with the upper surface 170U of the first upper insulating layer 170. The upper surfaces 200C_U of the cell conductive lines 200C may be positioned at the same height as the upper surface 170U of the first upper insulating layer 170. In some embodiments, the upper surfaces 200C_U of the cell conductive lines 200C may be coplanar with the upper surface 170U of the first upper insulating layer 170.

A peripheral insulating layer 180 may be disposed on the lower insulating layer 130 on the peripheral region PR. The upper surface 130U of the lower insulating layer 130 on the peripheral region PR may be positioned at a height lower than the recessed upper surface 130RU of the lower insulating layer 130 on the cell region PR, and the peripheral insulating layer 180 may be in contact with the upper surface 130U of the lower insulating layer 130 on the peripheral region PR. The peripheral insulating layer 180 may extend onto the lower insulating layer 130 on the boundary region BR, and may be in contact with a side surface 160S of the cell insulating layer 160 and a side surface 170S of the first upper insulating layer 170. An upper surface 180U1 of the peripheral insulating layer 180 on the peripheral region PR may be positioned at a height lower than an upper surface 170U of the first upper insulating layer 170. An uppermost surface 180U2 of the peripheral insulating layer 180 on the boundary region BR may be positioned at a height higher than the upper surface 180U1 of the peripheral insulating layer 180 on the peripheral region PR. The peripheral insulating layer 180 may have a stepped structure 182 on the boundary region BR, and the stepped structure 182 may have a line shape extending in the second direction D2 on the boundary region BR when viewed from a plan view. In some embodiments, a portion of the peripheral insulating layer 180 formed on the boundary region BR may include a surface slanted downwardly toward the substrate 100, and that slanted surface may connect the uppermost surface 180U2 of the peripheral insulating layer 180 on the boundary region BR to the upper surface 180U1 of the peripheral insulating layer 180 on the peripheral region PR as illustrated in FIG. 3.

The peripheral insulating layer 180 may include a material different from a material of the cell insulating layer 160. The peripheral insulating layer 180 may include a material having a lower dielectric constant (k) than that of the cell insulating layer 160. The peripheral insulating layer 180 may include, for example, silicon oxide, silicon nitride, and/or silicon oxynitride. For example, the peripheral insulating layer 180 may include an ELK insulating material having a dielectric constant k of less than about 2.5 or 2.0, and may include, for example, porous SiOC.

Peripheral conductive lines 200P may be disposed on the lower insulating layer 130 on the peripheral region PR and within the peripheral insulating layer 180. The peripheral insulating layer 180 may cover the peripheral conductive lines 200P. In some embodiments, the peripheral conductive lines 200P may be in the peripheral insulating layer 180. Upper surfaces 200P_U of the peripheral conductive lines 200P may be not covered by the peripheral insulating layer 180, and may be exposed. The peripheral insulating layer 180 may not extend on (e.g., may not cover) the upper surfaces 200P_U of the peripheral conductive lines 200P. Accordingly, the upper surfaces 200P_U of the peripheral conductive lines 200P may be free of the peripheral insulating layer 180. The upper surfaces 200P_U of the peripheral conductive lines 200P may be substantially coplanar with the upper surface 180U1 of the peripheral insulating layer 180 on the peripheral region PR. The upper surfaces 200P_U of the peripheral conductive lines 200P may be positioned at the same height as the upper surface 180U1 of the peripheral insulating layer 180 on the peripheral region PR. In some embodiments, the upper surfaces 200P_U of the peripheral conductive lines 200P may be coplanar with the upper surface 180U1 of the peripheral insulating layer 180 on the peripheral region PR. The upper surfaces 200P_U of the peripheral conductive lines 200P may be positioned at a height lower than the upper surfaces 200C_U of the cell conductive lines 200C and the upper surface 170U of the first upper insulating layer 170, and may be positioned at a height lower than the uppermost surface 180U2 of the peripheral insulating layer 180 on the boundary region BR.

Peripheral conductive contacts 210P may be disposed on the peripheral region PR and below the peripheral conductive lines 200P. The peripheral conductive contacts 210P may be electrically connected to the peripheral conductive lines 200P. Each of the peripheral conductive contacts 210P may be in contact with a corresponding peripheral conductive line 200P among the peripheral conductive lines 200P without a boundary (e.g., a visible interface). Each of the peripheral conductive contacts 210P and the peripheral conductive line 200P corresponding thereto may be connected to each other to form an integral body (e.g., a unitary element). Each of the peripheral conductive contacts 210P may pass through a lower portion of the peripheral insulating layer 180. Each of the peripheral conductive contacts 210P may pass through the lower insulating layer 130 and the protective insulating layer 120 on the peripheral region PR, and may be electrically connected to the corresponding one of the uppermost wiring lines 102.

The cell conductive lines 200C, the peripheral conductive lines 200P, and the peripheral conductive contacts 210P may include a conductive material, for example, metal (e.g., copper). The cell conductive lines 200C, the peripheral conductive lines 200P, and the peripheral conductive contacts 210P may include the same material as each other.

A second upper insulating layer 220 may be disposed on the cell region CR and on the first upper insulating layer 170. The second upper insulating layer 220 may extend from the upper surface 170U of the first upper insulating layer 170 to the upper surfaces 200C_U of the cell conductive lines 200C. The second upper insulating layer 220 may be in contact with the upper surface 170U of the first upper insulating layer 170 and the upper surfaces 200C_U of the cell conductive lines 200C. The second upper insulating layer 220 may extend onto the peripheral insulating layer 180 on the boundary region BR and the peripheral region PR. The second upper insulating layer 220 may be in contact with the uppermost surface 180U2 of the peripheral insulating layer 180 on the boundary region BR and the upper surface 180U1 of the peripheral insulating layer 180 on the peripheral region PR. The second upper insulating layer 220 may extend from the upper surface 180U1 of the peripheral insulating layer 180 on the peripheral region PR to the upper surfaces 200P_U of the peripheral conductive lines 200P, and may be in contact with the upper surfaces 200P_U of the peripheral conductive lines 200P.

The second upper insulating layer 220 may include the same material as the first upper insulating layer 170. For example, the second upper insulating layer 220 may include silicon nitride (e.g., SiCN).

The first upper insulating layer 170 and the second upper insulating layer 220 may be collectively referred to as a stop insulating layer (STL). In this case, a thickness T1 of the stop insulating layer STL on the cell region CR may be greater than a thickness T2 of the stop insulating layer STL on the peripheral region PR.

FIGS. 5 to 10 are views illustrating a method of manufacturing a semiconductor device according to some embodiments of the inventive concept, and are cross-sectional views corresponding to line I-I' in FIG. 2. For simplicity of description, descriptions overlapping with those of the semiconductor device described with reference to FIGS. 1 to 3 and FIGS. 4A and 4B are omitted.

Figure 5:
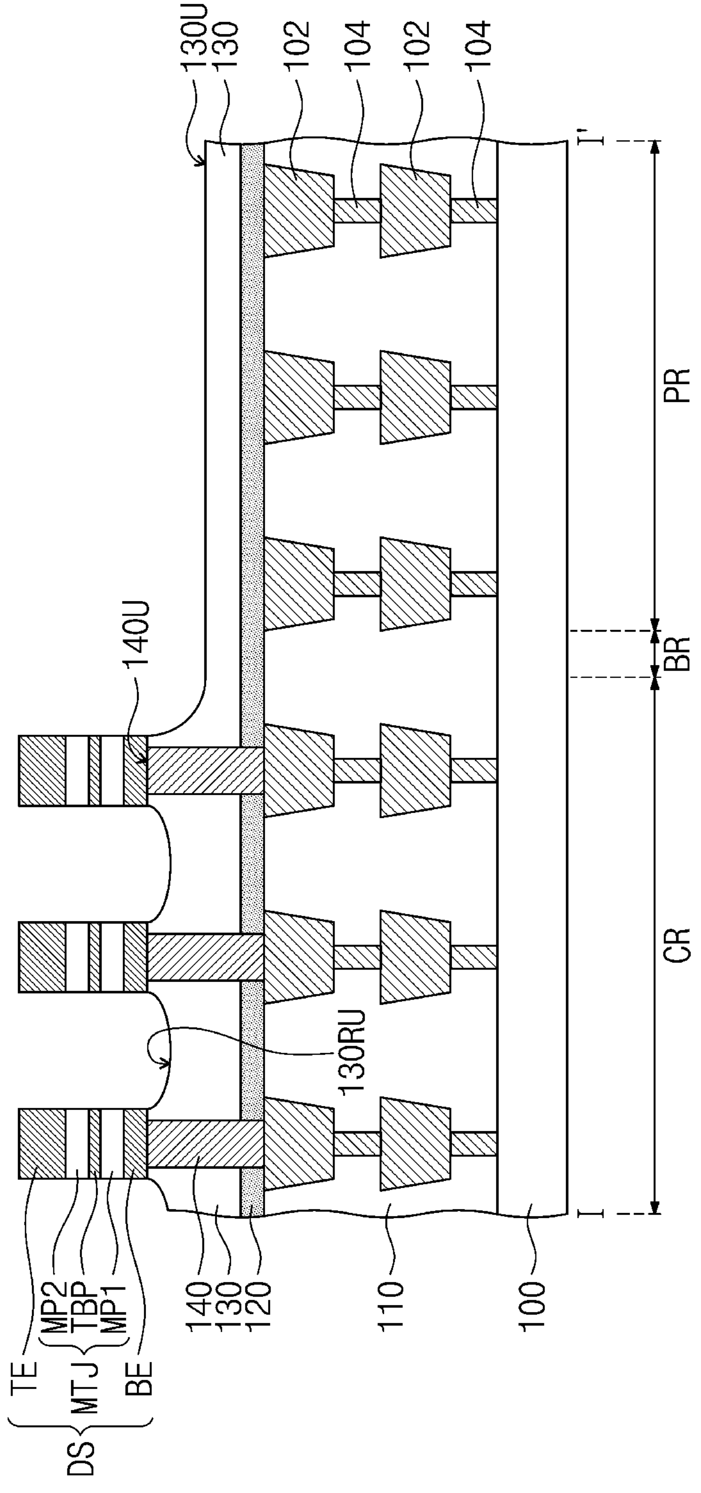
FIGS. 5 to 10 are views illustrating a method of manufacturing a semiconductor device according to some embodiments of the inventive concept, and are cross-sectional views corresponding to line I-I' in FIG. 2.

Referring to FIGS. 2 and 5, a substrate 100 including a cell region CR, a peripheral region PR, and a boundary region BR therebetween may be provided. Selection elements (SE in FIG. 1) may be formed on the substrate 100, and wiring structures 102 and 104 may be formed on the selection elements. The wiring structures 102 and 104 may be formed on the cell region CR and the peripheral region PR of the substrate 100. The wiring structures 102 and 104 may include wiring lines 102 and wiring contacts 104 connected to the wiring lines 102. Each of the wiring lines 102 may be electrically connected to a terminal (e.g., a drain terminal) of a corresponding one of the selection elements through a corresponding one of the wiring contacts 104. A wiring insulating layer 110 may be formed on the substrate 100 and may cover the wiring structures 102 and 104. The wiring structures 102 and 104 may be formed in the wiring insulating layer 110. The wiring insulating layer 110 may expose upper surfaces of the uppermost wiring lines 102 of the wiring lines 102. The wiring insulating layer 110 may not extend on (e.g., may not cover) the upper surfaces of the uppermost wiring lines 102 of the wiring lines 102. Accordingly, the upper surfaces of the uppermost wiring lines 102 of the wiring lines 102 may be free of the wiring insulating layer 110.

A protective insulating layer 120 may be formed on the wiring insulating layer 110. The protective insulating layer 120 may be formed on the wiring insulating layer 110 on the cell region CR and may extend onto the wiring insulating layer 110 on the boundary region BR and the peripheral region PR. The protective insulating layer 120 may cover the exposed upper surfaces of the uppermost wiring lines 102.

A lower insulating layer 130 may be formed on the protective insulating layer 120. The lower insulating layer 130 may be formed on the protective insulating layer 120 on the cell region CR and may extend onto the protective insulating layer 120 on the boundary region BR and the peripheral region PR.

Lower electrode contacts 140 may be formed in the lower insulating layer 130 on the cell region CR. Each of the lower electrode contacts 140 may pass through the lower insulating layer 130 and the protective insulating layer 120 on the cell region CR, and may be electrically connected to one of the uppermost wiring lines 102. Forming the lower electrode contacts 140 may include, for example, forming lower contact holes penetrating the lower insulating layer 130 and the protective insulating layer 120 on the cell region CR, forming a lower contact layer filling the lower contact holes, and planarizing the lower contact layer until an upper surface of the lower insulating layer 130 is exposed. Through the planarization process, the lower electrode contacts 140 may be formed in the lower contact holes, respectively.

Data storage patterns DS may be formed on the lower insulating layer 130 on the cell region CR and may be formed on the lower electrode contacts 140, respectively. Each of the data storage patterns DS may include a lower electrode BE, a magnetic tunnel junction pattern MTJ, and an upper electrode TE, which are sequentially stacked on each of the lower electrode contacts 140. The magnetic tunnel junction pattern MTJ may include a first magnetic pattern MP1, a second magnetic pattern MP2, and a tunnel barrier pattern TBP therebetween. The first magnetic pattern MP1 may be disposed between the lower electrode BE and the tunnel barrier pattern TBP, and the second magnetic pattern MP2 may be disposed between the upper electrode TE and the tunnel barrier pattern TBP. Forming the data storage patterns DS may include, for example, sequentially forming a lower electrode layer and a magnetic tunnel junction layer on the lower insulating layer 130, forming a conductive mask pattern on the magnetic tunnel junction layer, and sequentially etching the magnetic tunnel junction layer and the lower electrode layer using the conductive mask pattern as an etching mask. The magnetic tunnel junction layer may include a first magnetic layer, a tunnel barrier layer, and a second magnetic layer sequentially stacked on the lower electrode layer. The magnetic tunnel junction layer and the lower electrode layer may be formed by, for example, sputtering, chemical vapor deposition, or atomic layer deposition.

As the magnetic tunnel junction layer and the lower electrode layer are etched, the magnetic tunnel junction pattern MTJ and the lower electrode BE may be formed, respectively. Etching the magnetic tunnel junction layer may include sequentially etching the second magnetic layer, the tunnel barrier layer, and the first magnetic layer using the conductive mask pattern as an etch mask. The second magnetic layer, the tunnel barrier layer, and the first magnetic layer may be etched to form the second magnetic pattern MP2, the tunnel barrier pattern TBP, and the first magnetic pattern MP1, respectively. The remainder of the conductive mask pattern remaining on the magnetic tunnel junction pattern MTJ after etching the magnetic tunnel junction layer and the lower electrode layer may form the upper electrode TE.

An etching process of etching the magnetic tunnel junction layer and the lower electrode layer may be, for example, an ion beam etching process using an ion beam. The ion beam may include inert ions. Through the etching process, an upper portion of the lower insulating layer 130 between the data storage patterns DS may be recessed. Accordingly, the lower insulating layer 130 on the cell region CR may have a upper surface 130RU recessed toward the substrate 100. The recessed upper surface 130RU (e.g., a lowermost end of the recessed upper surface 130RU) of the lower insulating layer 130 may be positioned at a height lower than upper surfaces 140U of the lower electrode contacts 140. In addition, an upper portion of the lower insulating layer 130 on the boundary region BR and the peripheral region PR may be recessed by the etching process. The upper surface

130U of the lower insulating layer 130 on the peripheral region PR may be positioned at a height lower than the recessed upper surface 130RU of the lower insulating layer 130 on the cell region CR.

Figure 6:
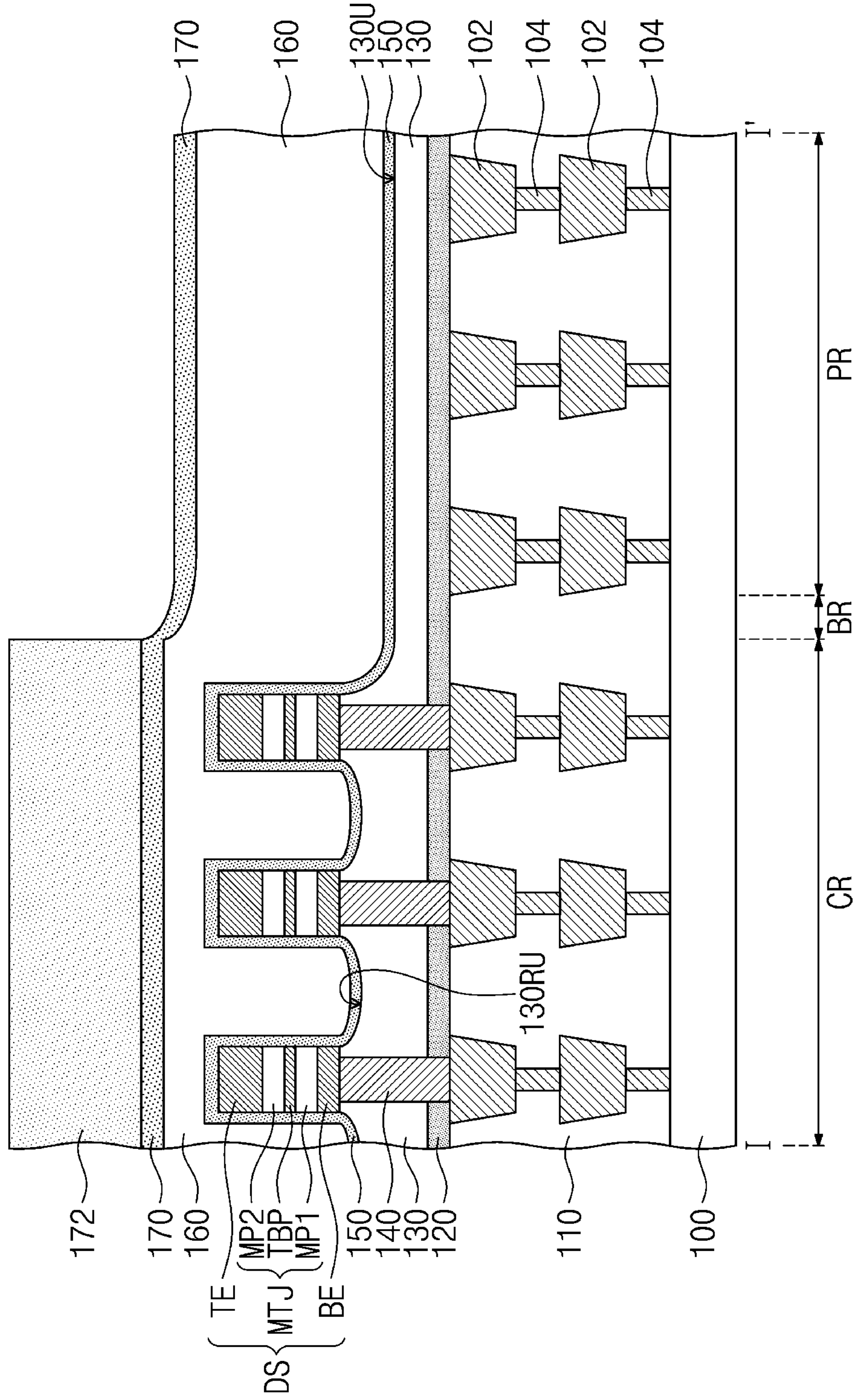

Referring to FIGS. 2 and 6, a capping insulating layer 150 may be formed on the lower insulating layer 130 on the cell region CR, and may conformally cover upper and side surfaces of each of the data storage patterns DS. The capping insulating layer 150 may conformally cover the recessed upper surface 130RU of the lower insulating layer 130 on the cell region CR, and may extend onto the lower insulating layer 130 on the boundary region BR and the peripheral region PR.

A cell insulating layer 160 may be formed on the capping insulating layer 150. The cell insulating layer 160 may be formed on the capping insulating layer 150 on the cell region CR to cover the data storage patterns DS and may fill a space between the data storage patterns DS. The cell insulating layer 160 may extend onto the capping insulating layer 150 on the boundary region BR and the peripheral region PR.

A first upper insulating layer 170 may be formed on the cell insulating layer 160. The first upper insulating layer 170 may be formed on the cell insulating layer 160 on the cell region CR, and may extend onto the cell insulating layer 160 on the boundary region BR and the peripheral region PR.

A cell mask pattern 172 may be formed on the first upper insulating layer 170 on the cell region CR. The cell mask pattern 172 may expose the first upper insulating layer 170 on the boundary region BR and the peripheral region PR. The cell mask pattern 172 may be, for example, a photoresist pattern.

Figure 7:
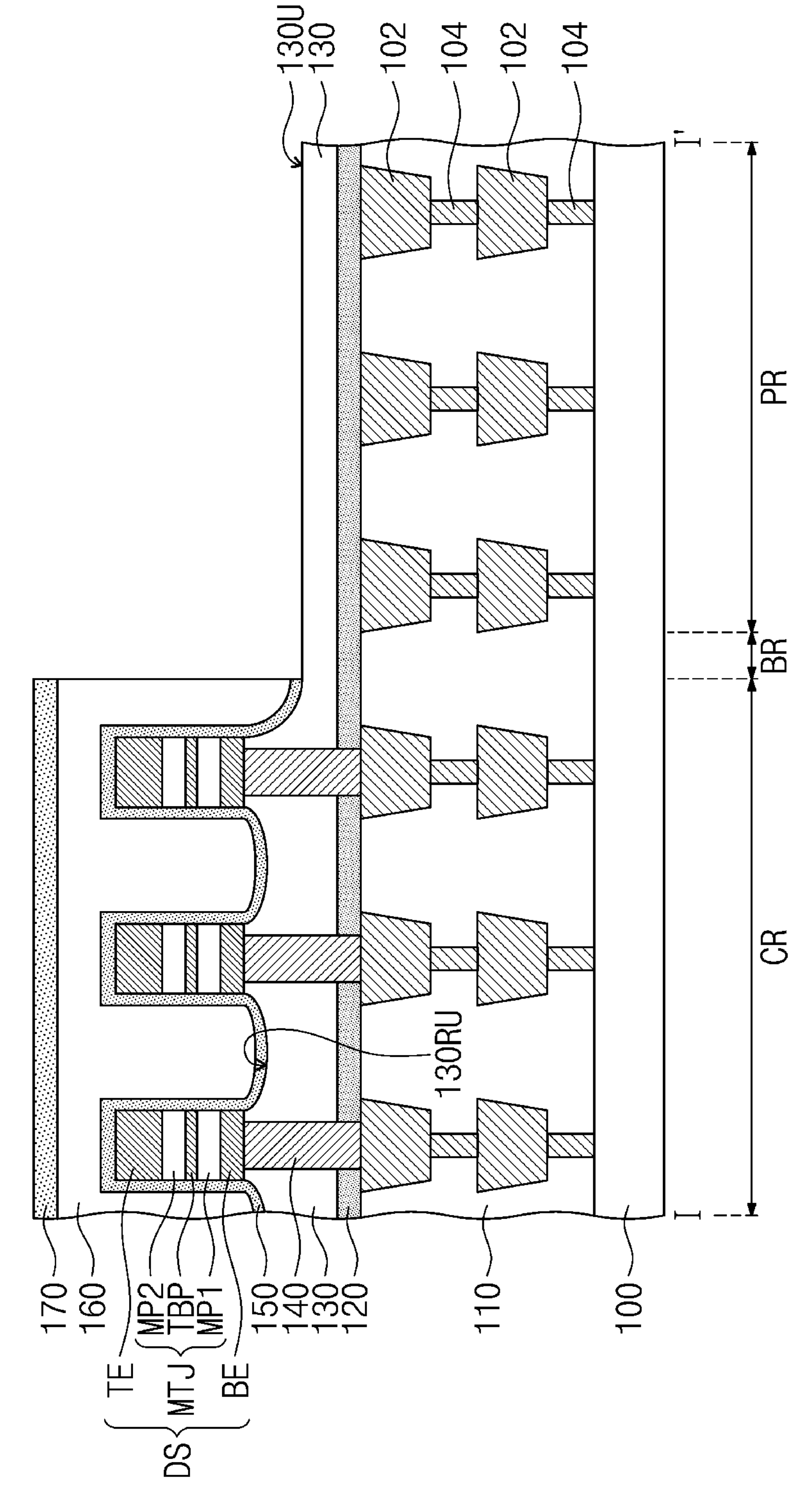

Referring to FIGS. 2 and 7, the first upper insulating layer 170, the cell insulating layer 160, and the capping insulating layer 150 may be removed from the boundary region BR and the peripheral region PR. Removing the first upper insulating layer 170, the cell insulating layer 160, and the capping insulating layer 150 from the boundary region BR and the peripheral region PR may include etching the first upper insulating layer 170, the cell insulating layer 160, and the capping insulating layer 150 on the boundary region BR and the peripheral region PR using the cell mask pattern 172 as an etch mask. As the capping insulating layer 150 on the boundary region BR and the peripheral region PR is removed, the upper surface 130U of the lower insulating layer 130 on the boundary region BR and the peripheral region PR this may be exposed. Thereafter, the cell mask pattern 172 may be removed. The cell mask pattern 172 may be removed by, for example, an ashing and/or a strip process.

Figure 8:
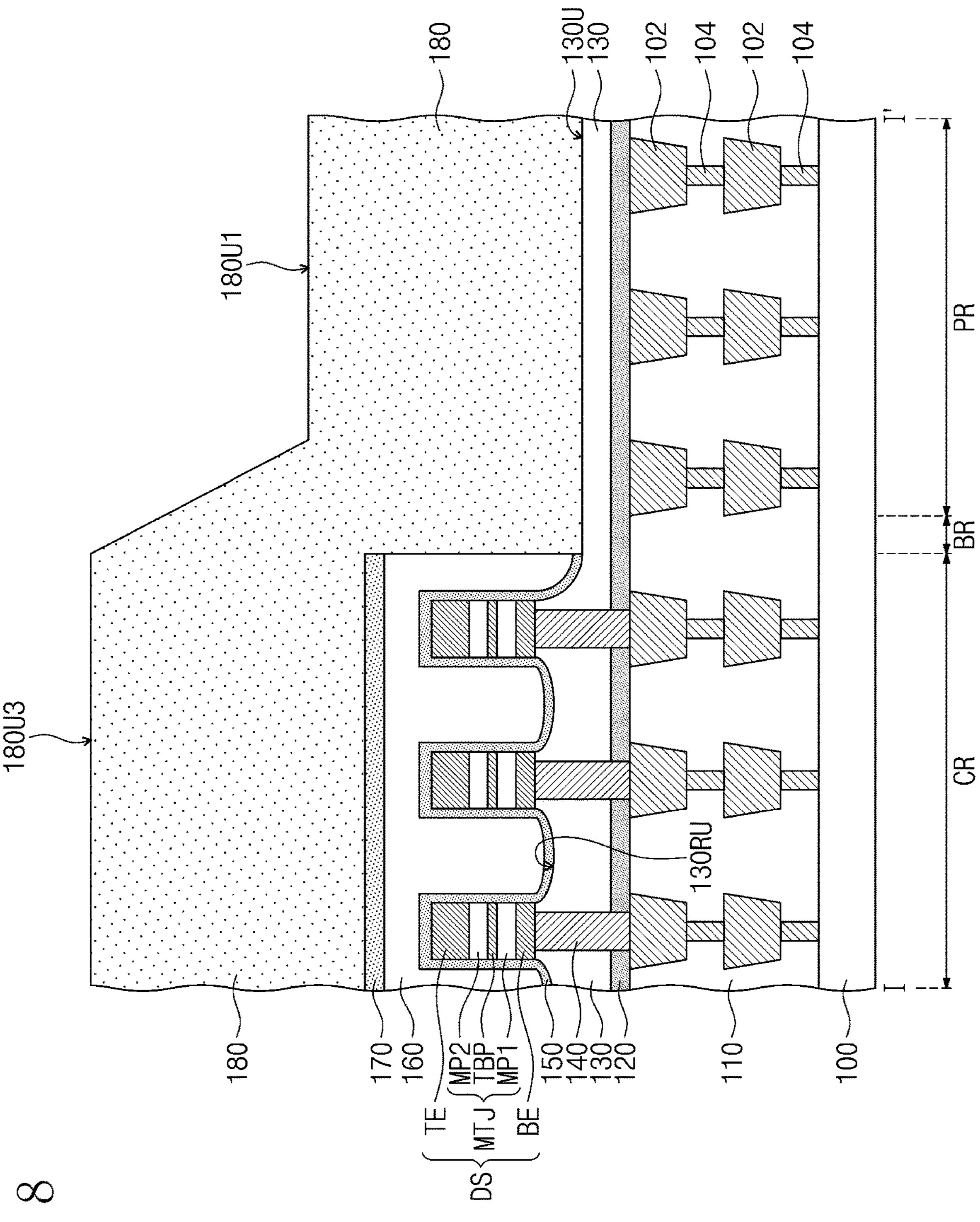

Referring to FIGS. 2 and 8, a peripheral insulating layer 180 may be formed on the first upper insulating layer 170 on the cell region CR, and may extend onto the lower insulating layer 130 on the boundary region BR and the peripheral region PR. The peripheral insulating layer 180 may be in contact with the exposed upper surface 130U of the lower insulating layer 130 on the boundary region BR and the peripheral region PR. An upper surface 180U1 of the peripheral insulating layer 180 on the peripheral region PR may be positioned at a lower height than an upper surface 180U3 of the peripheral insulating layer 180 on the cell region CR. The peripheral insulating layer 180 may have a stepped structure on the boundary region BR. The peripheral insulating layer 180 may include an insulating material having a lower dielectric constant than the cell insulating layer 160.

Figure 9:
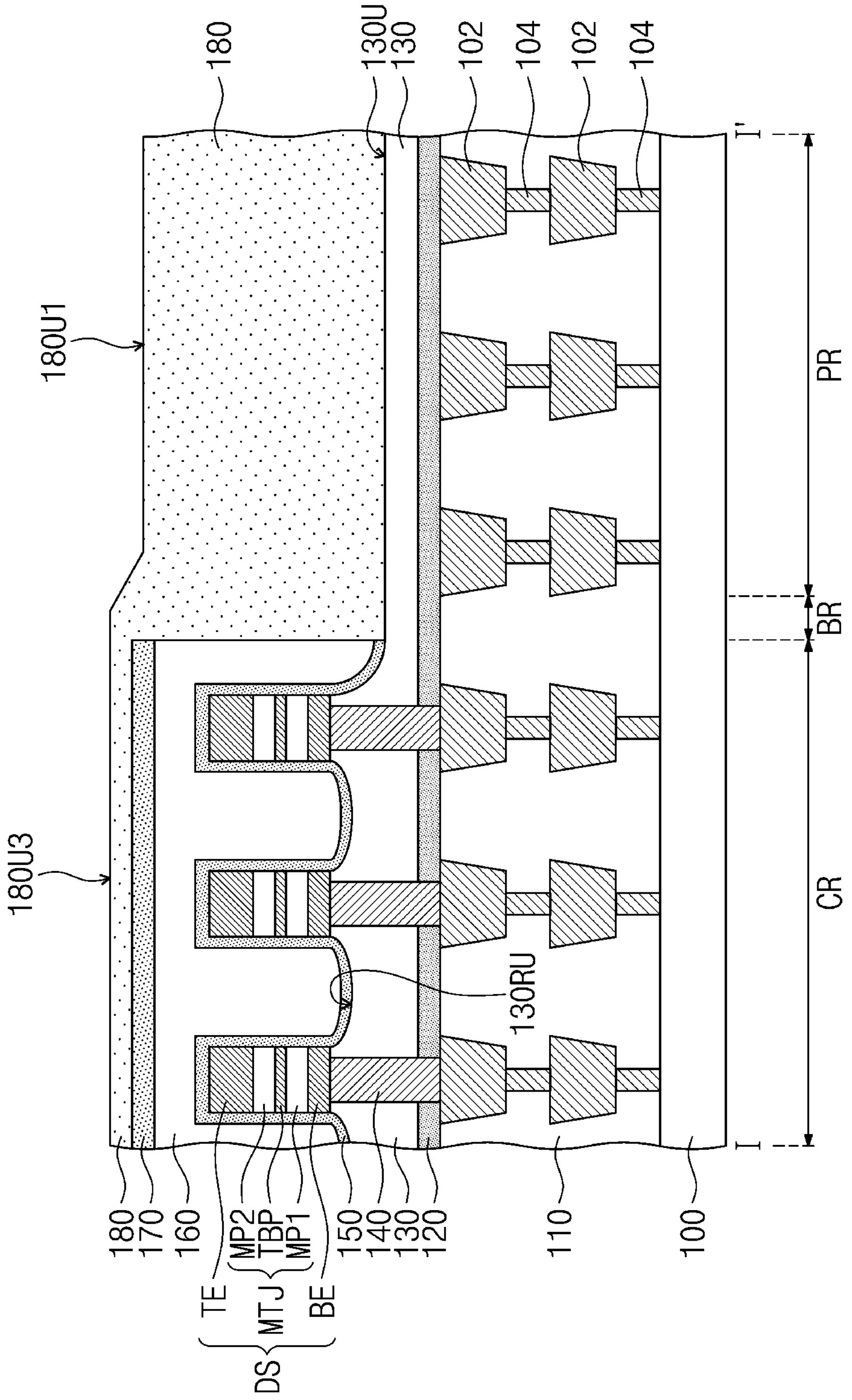

Referring to FIGS. 2 and 9, a planarization process may be performed on the peripheral insulating layer 180. For example, the planarization process may be performed using at least one of an etch-back process and a chemical mechanical polishing process. The planarization process may be performed until a portion of the peripheral insulating layer 180 remaining on the first upper insulating layer 170 reaches a predetermined thickness (e.g., a desired thickness). After the planarization process, the upper surface 180U1 of the peripheral insulating layer 180 on the peripheral region PR may be positioned at a lower height than the upper surface 180U3 of the peripheral insulating layer 180 on the cell region CR. The peripheral insulating layer 180 may have the stepped structure on the boundary region BR.

Figure 10:
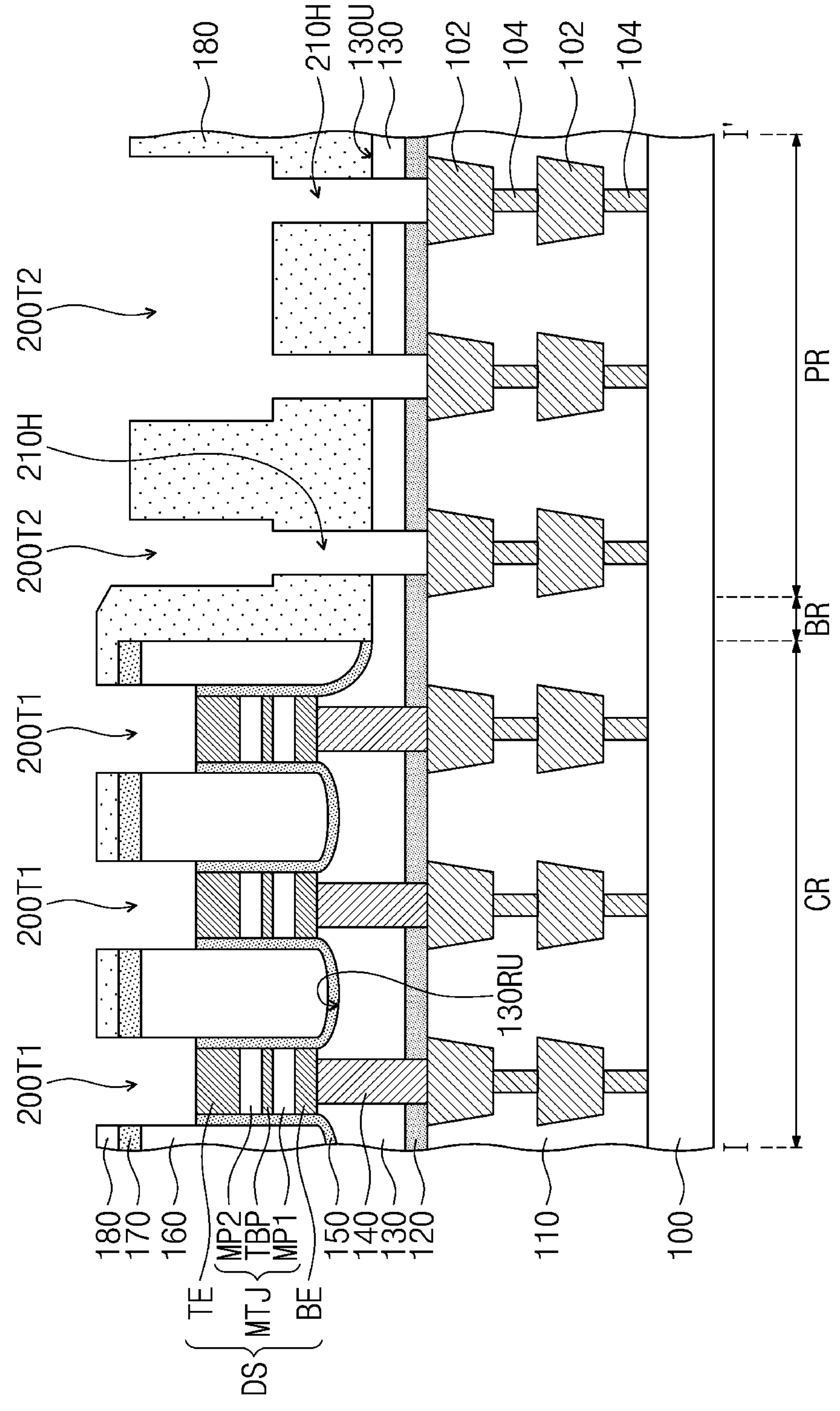

Referring to FIGS. 2 and 10, cell trenches 200T1 may be formed in the peripheral insulating layer 180, the first upper insulating layer 170, and the cell insulating layer 160 on the cell region CR. Each of the cell trenches 200T1 may pass through the peripheral insulating layer 180 and the first upper insulating layer 170 on the cell region CR, and may pass through an upper portion of the cell insulating layer 160 and the capping insulating layer 150 to expose an upper surface of a corresponding data storage pattern DS among the data storage patterns DS. The cell trenches 200T1 may be spaced apart from each other in the first direction D1 and may extend in the second direction D2. Each of the cell trenches 200T1 may expose upper surfaces of the data storage patterns DS spaced apart from each other in the second direction D2.

Peripheral trenches 200T2 may be formed in the peripheral insulating layer 180 on the peripheral region PR. Each of the peripheral trenches 200T2 may pass through an upper portion of the peripheral insulating layer 180 on the peripheral region PR. Peripheral holes 210H may extend from bottom surfaces of the peripheral trenches 200T2 toward the substrate 100. Each of the peripheral holes 210H may pass through a lower portion of the peripheral insulating layer 180 on the peripheral region PR, and the lower insulating layer 130, and the protective insulating layer 120 on the peripheral region PR to expose an upper surface of a corresponding wiring line 102 among the uppermost wiring lines 102.

Referring back to FIGS. 2 and 3, cell conductive lines 200C may be formed in the cell trenches 200T1, respectively, and peripheral conductive lines 200P may be formed in the peripheral trenches 200T2, respectively. Peripheral conductive contacts 210P may be formed in each of the peripheral holes 210H. Forming the cell conductive lines 200C, the peripheral conductive lines 200P, and the peripheral conductive contacts 210P may include, for example, forming a conductive layer filling the cell trenches 200T1, the peripheral trenches 200T2, and the peripheral holes 210H on the peripheral insulating layer 180, and planarizing the conductive layer until the upper surface 170U of the first upper insulating layer 170 on the cell region CR is exposed. During the planarization process of the conductive layer, the peripheral insulating layer 180 on the cell region CR may be removed, and the upper surface 180U1 of the peripheral insulating layer 180 on the peripheral region PR may be positioned at a height lower than the upper surface 170U of the insulating layer 170. An uppermost surface 180U2 of the peripheral insulating layer 180 on the boundary region BR may be positioned at a height higher than the upper surface 180U1 of the peripheral insulating layer 180 on the peripheral region PR. The peripheral insulating layer 180 may be in contact with a side surface 160S of the cell insulating layer 160 and a side surface 170S of the first upper insulating layer 170 on the boundary region BR. The peripheral insulating layer 180 may have a stepped structure 182 on the boundary region BR.

Due to the planarization process of the conductive layer, the upper surfaces 200C_U of the cell conductive lines 200C may be substantially coplanar with the upper surface 170U of the first upper insulating layer 170. The upper surfaces 200C_U of the cell conductive lines 200C may be positioned at the same height as the upper surface 170U of the first upper insulating layer 170. In some embodiments, the upper surfaces 200C_U of the cell conductive lines 200C may be coplanar with the upper surface 170U of the first upper insulating layer 170. By the planarization process of the conductive layer, the upper surfaces 200P_U of the peripheral conductive lines 200P may be substantially coplanar with the upper surface 180U1 of the peripheral insulating layer 180 on the peripheral region PR. The upper surfaces 200P_U of the peripheral conductive lines 200P may be positioned at the same height as the upper surface 180U1 of the peripheral insulating layer 180 on the peripheral region PR. In some embodiments, the upper surfaces 200P_U of the peripheral conductive lines 200P may be coplanar with the upper surface 180U1 of the peripheral insulating layer 180 on the peripheral region PR. The upper surfaces 200P_U of the peripheral conductive lines 200P may be positioned at a height lower than the upper surfaces 200C_U of the cell conductive lines 200C and the upper surface 170U of the first upper insulating layer 170, and may be positioned at a height lower than the uppermost surface 180U2 of the peripheral insulating layer 180 on the boundary region BR.

A second upper insulating layer 220 may be formed on the first upper insulating layer 170 on the cell region CR and may cover the upper surfaces 200C_U of the cell conductive lines 200C. The second upper insulating layer 220 may extend onto the peripheral insulating layer 180 on the boundary region BR and the peripheral region PR, and may cover the upper surfaces 200P_U of the peripheral conductive lines 200P.

According to the inventive concept, the peripheral insulating layer 180 having a relatively thick thickness may be formed on the cell region CR, the boundary region BR, and the peripheral region BR of the substrate 100, and the planarization process may be performed such that the portion of the peripheral insulating layer 180 with a predetermined thickness (e.g., a required thickness) remains on the first upper insulating layer 170 on the cell region CR. As the planarization process is performed, a separate photolithography process and an etching process for removing the peripheral insulating layer 180 on the cell region CR may not be required and may be omitted. In addition, as the planarization process is performed until the portion of the peripheral insulating layer 180 remaining on the first upper insulating layer 170 reaches the required thickness, deposition of an additional layer on the first upper insulating layer 170 may not be required and may be omitted. Accordingly, the manufacturing process of the semiconductor device may be simplified, and as a result, the semiconductor device that is easily manufactured to reduce/minimize defects in the manufacturing process and the method of manufacturing the same may be provided.

According to the inventive concept, the peripheral insulating layer having a relatively thick thickness may be formed on the cell region, the boundary region, and the peripheral region of the substrate, and the planarization process may be performed such that the portion of the peripheral insulating layer with a predetermined thickness (e.g., a required thickness) remains on the cell region. As the planarization process is performed, a separate photolithography process and an etching process for removing the peripheral insulating layer on the cell region may not be required and may be omitted, and deposition of an additional layer on the cell region may not be required and may be omitted. Accordingly, the manufacturing process of the semiconductor device may be simplified, and as a result, the semiconductor device that is easily manufactured and is capable of reducing/minimizing defects in the manufacturing process and the method of manufacturing the same may be provided.

Although terms (e.g., first, second or third) may be used herein to describe various elements, these elements should not be limited by these terms. These terms are only used to distinguish one element from another. For example, a first element may be referred to as a second element, and, similarly a second element may be referred to as a first element without departing from the teachings of the disclosure.

As used herein, an element or region that is “covering” or “surrounding” or “filling” another element or region may completely or partially cover or surround or fill the other element or region. Further, the term “and/or” includes any and all combinations of one or more of the associated listed items.

While embodiments are described above, a person skilled in the art may understand that many modifications and variations are made without departing from the spirit and scope of the inventive concept defined in the following claims. Accordingly, the example embodiments of the inventive concept should be considered in all respects as illustrative and not restrictive, with the spirit and scope of the inventive concept being indicated by the appended claims.

What is claimed is:

1. A semiconductor device comprising:

a substrate including a cell region, a peripheral region, and a boundary region therebetween;

a lower insulating layer on the cell region and extending onto the boundary region and the peripheral region;

a cell insulating layer on the lower insulating layer on the cell region;

data storage patterns in the cell insulating layer on the lower insulating layer;

a first upper insulating layer on the cell insulating layer;

a peripheral insulating layer on the lower insulating layer on the peripheral region; and peripheral conductive lines in the peripheral insulating layer on the lower insulating layer, wherein the peripheral insulating layer extends onto the lower insulating layer on the boundary region, wherein a side of the peripheral insulating layer is in contact both with a side surface of the cell insulating layer and a side surface of the first upper insulating layer, wherein the peripheral insulating layer includes a material different from a material of the cell insulating layer, wherein the peripheral insulating layer has a stepped structure on the boundary region, wherein an upper surface of the peripheral insulating layer on the peripheral region is lower than an upper surface of the first upper insulating layer relative to the substrate, and wherein an uppermost surface of the peripheral insulating layer on the boundary region is higher than the upper surface of the peripheral insulating layer on the peripheral region relative to the substrate.

2. The semiconductor device of claim 1, further comprising cell conductive lines passing through the first upper insulating layer and an upper portion of the cell insulating layer to be connected to the data storage patterns, wherein upper surfaces of the peripheral conductive lines are lower than upper surfaces of the cell conductive lines relative to the substrate.

3. The semiconductor device of claim 2, wherein the upper surfaces of the peripheral conductive lines and the upper surface of the peripheral insulating layer on the peripheral region are at an equal height from the substrate.

4. The semiconductor device of claim 3, wherein the upper surfaces of the cell conductive lines and the upper surface of the first upper insulating layer are at an equal height from the substrate.

5. The semiconductor device of claim 2, further comprising a second upper insulating layer on the first upper insulating layer, wherein the upper surfaces of the cell conductive lines are free of the first upper insulating layer, and wherein the second upper insulating layer extends from the upper surface of the first upper insulating layer onto the upper surfaces of the cell conductive lines to be in contact with the upper surfaces of the cell conductive lines.

6. The semiconductor device of claim 5, wherein the upper surfaces of the peripheral conductive lines are free of the peripheral insulating layer, and wherein the second upper insulating layer extends onto the peripheral insulating layer on the boundary region and the peripheral region, and extends from the upper surface of the peripheral insulating layer on the peripheral region onto the upper surfaces of the peripheral conductive lines to be in contact with the upper surfaces of the peripheral conductive lines.

7. The semiconductor device of claim 1, wherein the lower insulating layer on the cell region comprises an upper surface that is recessed toward the substrate and is between the data storage patterns, and wherein an upper surface of the lower insulating layer on the peripheral region is lower than the recessed upper surface of the lower insulating layer on the cell region relative to the substrate.

8. The semiconductor device of claim 7, further comprising:

lower electrode contacts passing through the lower insulating layer on the cell region and connected to the data storage patterns, respectively; and peripheral conductive contacts connected to the peripheral conductive lines, respectively, and passing through the lower insulating layer and a lower portion of the peripheral insulating layer on the peripheral region.

9. The semiconductor device of claim 8, further comprising a wiring structure between the substrate and the lower electrode contacts and between the substrate and the peripheral conductive contacts, and wherein the wiring structure includes wiring lines vertically spaced apart from the substrate, and wherein the lower electrode contacts and the peripheral conductive contacts are electrically connected to the wiring lines, respectively.

10. The semiconductor device of claim 1, wherein the first upper insulating layer is made of SiCN.

11. A semiconductor device comprising:

a substrate including a cell region, a peripheral region, and a boundary region therebetween;

a lower insulating layer on the cell region and extending onto the boundary region and the peripheral region;

a cell insulating layer on the lower insulating layer on the cell region;

a first upper insulating layer on the cell insulating layer;

data storage patterns in the cell insulating layer on the lower insulating layer;

a peripheral insulating layer on the lower insulating layer on the peripheral region; and peripheral conductive lines in the peripheral insulating layer on the lower insulating layer, wherein the peripheral insulating layer includes a material different from a material of the cell insulating layer, wherein a side of the peripheral insulating layer is in contact both with a side surface of the cell insulating layer and a side surface of the first upper insulating layer, wherein the peripheral insulating layer extends onto the lower insulating layer on the boundary region and has a stepped structure on the boundary region, wherein an uppermost surface of the peripheral insulating layer on the boundary region is higher than an upper surface of the peripheral insulating layer on the peripheral region relative to the substrate, and wherein an upper surface of the first upper insulating layer is higher than the upper surface of the peripheral insulating layer on the peripheral region relative to the substrate.

12. The semiconductor device of claim 11, further comprising:

cell conductive lines passing through the first upper insulating layer and an upper portion of the cell insulating layer to be connected to the data storage patterns, wherein upper surfaces of the peripheral conductive lines are free of the peripheral insulating layer, and wherein the upper surfaces of the peripheral conductive lines are lower than the upper surfaces of the cell conductive lines relative to the substrate.

13. The semiconductor device of claim 12, wherein the lower insulating layer on the cell region comprises an upper surface that is recessed toward the substrate and is between the data storage patterns, and wherein an upper surface of the lower insulating layer on the peripheral region is lower than the recessed upper surface of the lower insulating layer on the cell region relative to the substrate.

14. The semiconductor device of claim 13, further comprising:

lower electrode contacts passing through the lower insulating layer on the cell region and connected to the data storage patterns, respectively; and peripheral conductive contacts connected to the peripheral conductive lines, respectively, and passing through the lower insulating layer and a lower portion of the peripheral insulating layer on the peripheral region.

15. The semiconductor device of claim 13, further comprising a capping insulating layer extending between the recessed upper surface of the lower insulating layer on the cell region and the cell insulating layer and extending between a side surface of each of the data storage patterns and the cell insulating layer, wherein the peripheral insulating layer is in contact with the upper surface of the lower insulating layer on the peripheral region.

16. The semiconductor device of claim 11, wherein the first upper insulating layer is made of SiCN.

* * * * *